United States Patent
Mehrotra

(10) Patent No.: US 8,588,719 B1
(45) Date of Patent: Nov. 19, 2013

(54) LOW POWER AUTOMATIC GAIN CONTROL

(71) Applicant: Broadcom Corporation, Irvine, CA (US)

(72) Inventor: Kartikeya Mehrotra, Bangalore (IN)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/624,655

(22) Filed: Sep. 21, 2012

Related U.S. Application Data

(60) Provisional application No. 61/701,829, filed on Sep. 17, 2012.

(51) Int. Cl.
*H04B 1/06* (2006.01)

(52) U.S. Cl.
USPC ........ 455/234.2; 455/130; 455/134; 455/136; 455/138; 375/316; 375/345

(58) Field of Classification Search
USPC ............. 455/130, 134, 136, 138, 219, 226.1, 455/232.1, 234.1, 234.2, 240.1, 241.1, 455/245.1, 251.1; 375/316, 345
See application file for complete search history.

(56) References Cited

U.S. PATENT DOCUMENTS

| | | | |
|---|---|---|---|
| 8,355,687 B2 * | 1/2013 | Wood | 455/232.1 |
| 2007/0004358 A1 * | 1/2007 | Moorti | 455/226.2 |
| 2009/0046607 A1 * | 2/2009 | Lee et al. | 370/294 |

* cited by examiner

*Primary Examiner* — Tuan Pham
(74) *Attorney, Agent, or Firm* — Garlick & Markison; Holly L. Rudnick

(57) ABSTRACT

A radio receiver includes a plurality of receiver signal strength indicator (RSSI) circuits coupled to respective output taps of various gain stages along the receiver chain. Each of the RSSI circuits generates a respective 1-bit clip information signal. A processor accumulates the clip information signals to estimate the signal strength of an inbound RF signal and sets a gain of the radio receiver based on the estimated signal strength.

20 Claims, 12 Drawing Sheets

LOW POWER AUTOMATIC GAIN CONTROL

CROSS REFERENCE TO RELATED APPLICATIONS

The present U.S. Utility Patent Application claims priority pursuant to 35 U.S.C. §119(e) to the following U.S. Provisional Patent Application which is hereby incorporated herein by reference in its entirety and made part of the present U.S. Utility Patent Application for all purposes:
1. U.S. Provisional Application Ser. No. 61/701,829, entitled "Low Power Automatic Gain Control," filed Sep. 17, 2012.

BACKGROUND OF THE INVENTION

1. Technical Field

The present invention relates generally to wireless communication and more particularly to automatic gain control of radio receiver.

2. Related Art

Communication systems are known to support wireless and wireline communications between wireless and/or wireline communication devices. Such communication systems range from national and/or international cellular telephone systems to the Internet to point-to-point in-home wireless networks to radio frequency identification (RFID) systems. Each type of communication system is constructed, and hence operates, in accordance with one or more communication standards. For instance, wireless communication systems may operate in accordance with one or more standards including, but not limited to, 3GPP, LTE, LTE Advanced, RFID, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution systems (MMDS), and/or variations thereof.

Depending on the type of wireless communication system, a wireless communication device, such as a cellular telephone, two-way radio, personal digital assistant (PDA), personal computer (PC), laptop computer, home entertainment equipment, RFID reader, RFID tag, et cetera communicates directly or indirectly with other wireless communication devices. For direct communications (also known as point-to-point communications), the participating wireless communication devices tune their receivers and transmitters to the same channel or channels (e.g., one of the plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switch telephone network, via the Internet, and/or via some other wide area network.

For each wireless communication device to participate in wireless communications, it includes a built-in radio transceiver (i.e., receiver and transmitter) or is coupled to an associated radio transceiver (e.g., a station for in-home and/or in-building wireless communication networks, RF modem, etc.). As is known, the receiver is coupled to one or more antennas (e.g., MIMO) and may include one or more low noise amplifiers, one or more intermediate frequency stages, a filtering stage, and a data recovery stage. The low noise amplifier(s) receives inbound RF signals via the antenna and amplifies them. The one or more intermediate frequency stages mix the amplified RF signals with one or more local oscillations to convert the amplified RF signal into baseband signals or intermediate frequency (IF) signals. The filtering stage filters the baseband signals or the IF signals to attenuate unwanted out of band signals to produce filtered signals. The data recovery stage recovers raw data from the filtered signals in accordance with the particular wireless communication standard.

As is also known, the transmitter includes a data modulation stage, one or more intermediate frequency stages, and a power amplifier. The data modulation stage converts raw data into baseband signals in accordance with a particular wireless communication standard. The one or more intermediate frequency stages mix the baseband signals with one or more local oscillations to produce RF signals. The power amplifier amplifies the RF signals prior to transmission via an antenna.

Disadvantages of conventional approaches will be evident to one skilled in the art when presented in the disclosure that follows.

BRIEF SUMMARY OF THE INVENTION

The technology described herein is directed to an apparatus and methods of operation that are further described in the following Brief Description of the Drawings and the Detailed Description of the Invention. Other features and advantages will become apparent from the following detailed description made with reference to the accompanying drawings.

BRIEF DESCRIPTION OF THE SEVERAL VIEWS OF THE DRAWING(S)

DETAILED DESCRIPTION OF THE INVENTION

Figure 1:
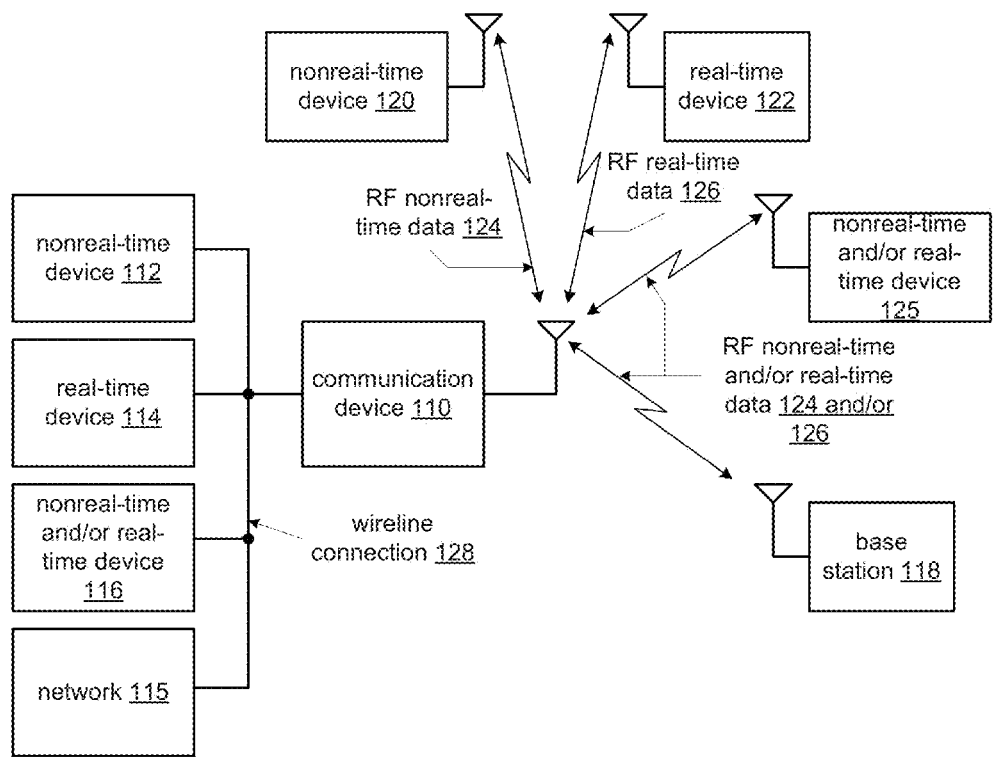
FIG. 1 is a schematic block diagram of an embodiment of a wireless communication system.

FIG. 1 is a schematic block diagram of a communication system in accordance with the technology described herein. In particular, a communication system is shown that includes a communication device 110 that communicates non-real-time data 124 and/or real-time data 126 wirelessly with one or more other devices such as base station 118, non-real-time device 120, real-time device 122, and non-real-time and/or real-time device 125. In addition, communication device 110 can also optionally communicate over a wireline connection with network 115, non-real-time device 112, real-time device 114, and non-real-time and/or real-time device 116.

In an embodiment of the present invention the wireline connection 128 can be a wired connection that operates in accordance with one or more standard protocols, such as a universal serial bus (USB), Institute of Electrical and Electronics Engineers (IEEE) 488, IEEE 1394 (Firewire), Ethernet, small computer system interface (SCSI), serial or parallel advanced technology attachment (SATA or PATA), or other wired communication protocol, either standard or proprietary. The wireless connection can communicate in accordance with a wireless network protocol such as WiHD, NGMS, IEEE 802.11a, ac, b, g, n, or other 802.11 standard protocol, Bluetooth, Ultra-Wideband (UWB), WIMAX, or other wireless network protocol, a wireless telephony data/voice protocol such as Global System for Mobile Communications (GSM), General Packet Radio Service (GPRS), Enhanced Data Rates for Global Evolution (EDGE), Personal Communication Services (PCS), or other mobile wireless protocol or other wireless communication protocol, either standard or proprietary. Further, the wireless communication path can include separate transmit and receive paths that use separate carrier frequencies and/or separate frequency channels. Alternatively, a single frequency or frequency channel can be used to bi-directionally communicate data to and from the communication device 110.

Communication device 110 can be a mobile phone such as a cellular telephone, a local area network device, personal area network device or other wireless network device, a personal digital assistant, game console, personal computer, laptop computer, or other device that performs one or more functions that include communication of voice and/or data via wireline connection 128 and/or the wireless communication path. Further communication device 110 can be an access point, base station or other network access device that is coupled to a network 115 such at the Internet or other wide area network, either public or private, via wireline connection 128. In an embodiment of the present invention, the real-time and non-real-time devices 112, 114 116, 118, 120, 122 and 125 can be personal computers, laptops, PDAs, mobile phones, such as cellular telephones, devices equipped with wireless local area network or Bluetooth transceivers, FM tuners, TV tuners, digital cameras, digital camcorders, or other devices that either produce, process or use audio, video signals or other data or communications.

In operation, the communication device includes one or more applications that include voice communications such as standard telephony applications, voice-over-Internet Protocol (VoIP) applications, local gaming, Internet gaming, email, instant messaging, multimedia messaging, web browsing, audio/video recording, audio/video playback, audio/video downloading, playing of streaming audio/video, office applications such as databases, spreadsheets, word processing, presentation creation and processing and other voice and data applications. In conjunction with these applications, the real-time data 126 includes voice, audio, video and multimedia applications including Internet gaming, etc. The non-real-time data 124 includes text messaging, email, web browsing, file uploading and downloading, etc.

In an embodiment of the present invention, the communication device 110 includes a wireless transceiver that includes one or more features or functions of the present invention. Such wireless transceivers shall be described in greater detail in association with FIGS. 2-17 that follow.

Figure 2:
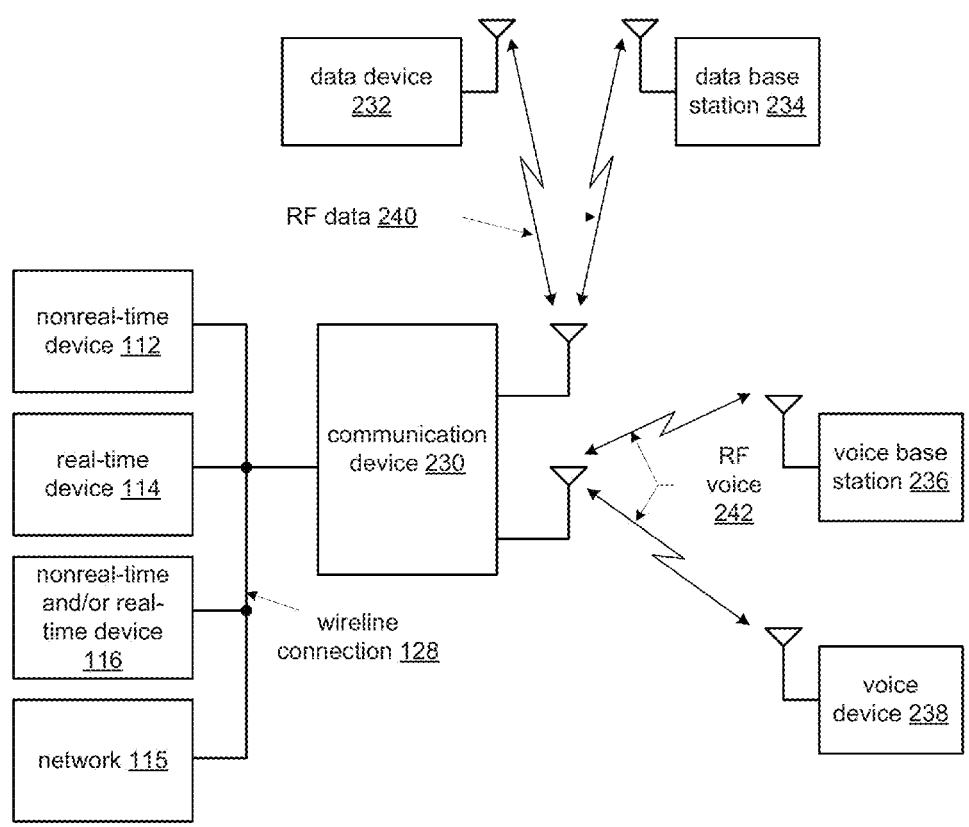
FIG. 2 is a schematic block diagram of another embodiment of a wireless communication system.

FIG. 2 is a schematic block diagram of an embodiment of another communication system in accordance with the present invention. In particular, FIG. 2 presents a communication system that includes many common elements of FIG. 1 that are referred to by common reference numerals. Communication device 230 is similar to communication device 110 and is capable of any of the applications, functions and features attributed to communication device 110, as discussed in conjunction with FIG. 1. However, communication device 230 includes two or more separate wireless transceivers for communicating, contemporaneously, via two or more wireless communication protocols with data device 232 and/or data base station 234 via RF data 240 and voice base station 236 and/or voice device 238 via RF voice signals 242.

Figure 3:
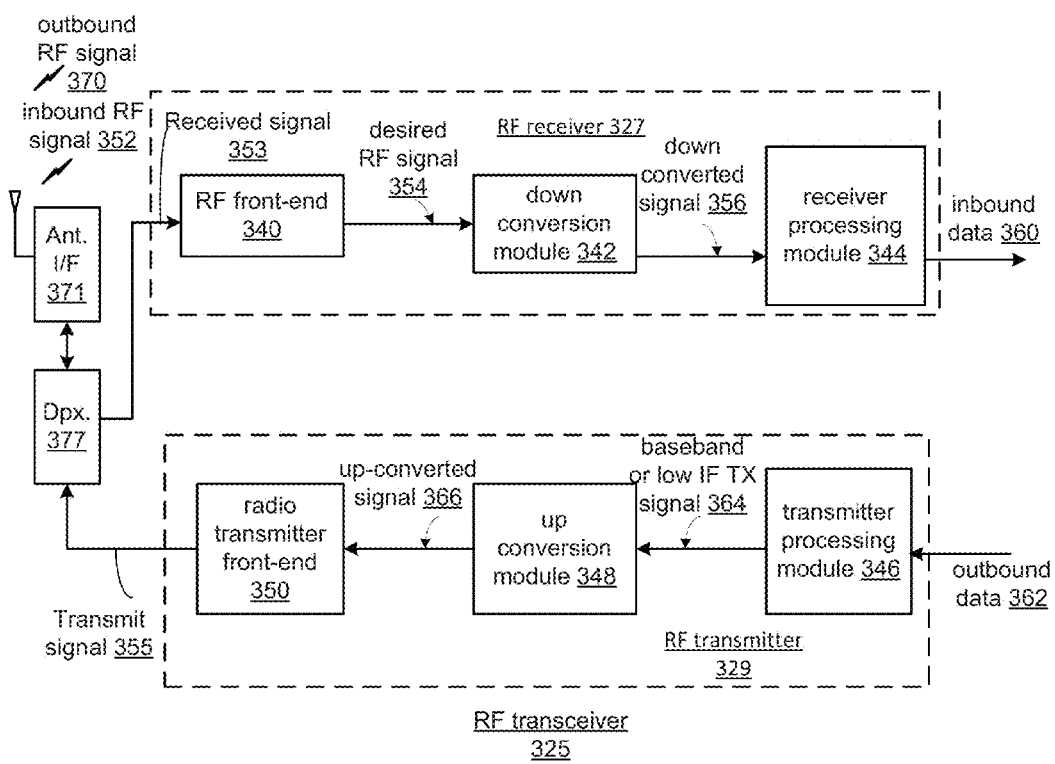
FIG. 3 is a schematic block diagram of an RF transceiver for a wireless communication system.

FIG. 3 is a schematic block diagram of an embodiment of a wireless transceiver 325 in accordance with the present invention. The RF transceiver 325 represents a wireless transceiver for use in conjunction with communication devices 110 or 230, base station 118, non-real-time device 120, real-time device 122, and non-real-time/real-time device 125, data device 232 and/or data base station 234, and voice base station 236 and/or voice device 238. RF transceiver 325 includes an RF transmitter 329, and an RF receiver 327. The RF receiver 327 includes a RF front end 340, a down conversion module 342 and a receiver processing module 344. The RF transmitter 329 includes a transmitter processing module 346, an up conversion module 348, and a radio transmitter front-end 350.

Figure 4:
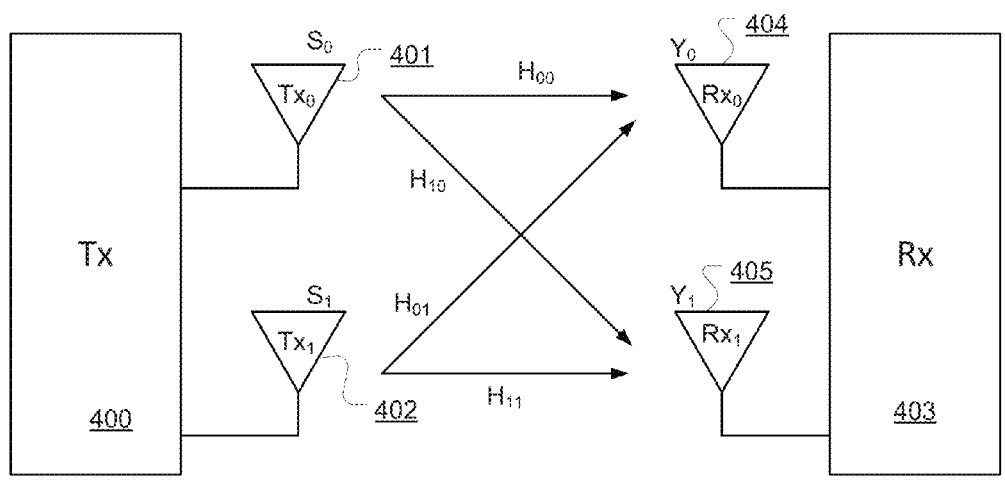
FIG. 4 is a schematic block diagram of a simple two antenna MIMO structure.

As shown, the receiver and transmitter are each coupled to an antenna through an antenna interface 371 and a diplexer (duplexer) 377, that couples the transmit signal 355 to the antenna to produce outbound RF signal 370 and couples inbound signal 352 to produce received signal 353. Alternatively, a transmit/receive switch can be used in place of diplexer 377. While a single antenna is represented in FIG. 3, the receiver and transmitter may share a multiple antenna structure that includes two or more antennas as shown in FIG. 4, discussed in greater detail hereafter.

In operation, the RF transmitter 329 receives outbound data 362. The transmitter processing module 346 packetizes outbound data 362 in accordance with a millimeter wave protocol or wireless telephony protocol, either standard or proprietary, to produce baseband or low intermediate frequency (IF) transmit (TX) signals 364 that includes an outbound symbol stream that contains outbound data 362. The baseband or low IF TX signals 364 may be digital baseband signals (e.g., have a zero IF) or digital low IF signals, where the low IF typically will be in a frequency range of one hundred kilohertz to a few megahertz. Note that the processing performed by the transmitter processing module 346 can include, but is not limited to, scrambling, encoding, puncturing, mapping, modulation, and/or digital baseband to IF conversion.

The up conversion module 348 includes a digital-to-analog conversion (DAC) module, a filtering and/or gain module, and a mixing section. The DAC module converts the baseband or low IF TX signals 364 from the digital domain to the analog domain. The filtering and/or gain module filters and/or adjusts the gain of the analog signals prior to providing it to the mixing section. The mixing section converts the analog baseband or low IF signals into up-converted signals 366 based on a transmitter local oscillation.

The radio transmitter front end 350 includes a power amplifier and may also include a transmit filter module. The power amplifier amplifies the up-converted signals 366 to produce outbound RF signals 370, which may be filtered by the transmitter filter module, if included. The antenna structure transmits the outbound RF signals 370 via an antenna interface 371 coupled to an antenna that provides impedance matching and optional band pass filtration.

The RF receiver 327 receives inbound RF signals 352 via the antenna and antenna interface 371 that operates to process the inbound RF signal 352 into received signal 353 for the receiver front-end 340. In general, antenna interface 371 provides impedance matching of antenna to the RF front-end 340, optional band pass filtration of the inbound RF signal 352.

The down conversion module 342 includes a mixing section, an analog to digital conversion (ADC) module, and may also include a filtering and/or gain module. The mixing section converts the desired RF signal 354 into a down converted signal 356 that is based on a receiver local oscillation, such as an analog baseband or low IF signal. The ADC module converts the analog baseband or low IF signal into a digital baseband or low IF signal. The filtering and/or gain module high pass and/or low pass filters the digital baseband or low IF signal to produce a down-converted (baseband or low IF) signal 356 that includes an inbound symbol stream. Note that the ordering of the ADC module and filtering and/or gain module may be switched, such that the filtering and/or gain module is an analog module.

The receiver processing module 344 processes the baseband or low IF signal 356 in accordance with a millimeter wave protocol, either standard or proprietary, to produce inbound data 360 such as probe data received from a probe device or devices (not shown). The processing performed by the receiver processing module 344 can include, but is not limited to, digital intermediate frequency to baseband conversion, demodulation, demapping, depuncturing, decoding, and/or descrambling.

In an embodiment of the present invention, receiver processing module 344 and transmitter processing module 346 can be implemented via use of a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The associated memory may be a single memory device or a plurality of memory devices that are either on-chip or off-chip. Such a memory device may be a read-only memory, random access memory, volatile memory, non-volatile memory, static memory, dynamic memory, flash memory, and/or any device that stores digital information. Note that when the processing devices implement one or more of their functions via a state machine, analog circuitry, digital circuitry, and/or logic circuitry, the associated memory storing the corresponding operational instructions for this circuitry is embedded with the circuitry comprising the state machine, analog circuitry, digital circuitry, and/or logic circuitry.

While the processing module 344 and transmitter processing module 346 are shown separately, it should be understood that these elements could be implemented separately, together through the operation of one or more shared processing devices or in combination of separate and shared processing.

In another embodiment, the receiver and transmitter may share a multiple input multiple output (MIMO) antenna structure, diversity antenna structure, phased array or other controllable antenna structure that includes a plurality of antennas and other RF transceivers similar to RF transceiver 325. Each of these antennas may be fixed, programmable, and antenna array or other antenna configuration. Also, the antenna structure of the wireless transceiver may depend on the particular standard(s) to which the wireless transceiver is compliant and the applications thereof.

FIG. 4 illustrates a simple two antenna MIMO structure. A transmitting (Tx) unit 400 is shown having two antennas 401, 402, while a receiving (Rx) unit 403 is shown having two antennas 404, 405. It is to be noted that both transmitting unit 400 and receiving unit 403 are generally both transceivers, but are shown as separate Tx and Rx units for exemplary purpose in FIG. 4. That is, Tx unit 400 is transmitting data and Rx unit 403 is receiving the transmitted data. The transmitted data symbols at antennas 401 ($Tx_0$), 402 ($Tx_1$) are noted as $S_0$ and $S_1$, respectively. The received data symbols at antennas 404 ($Rx_0$), 405 ($Rx_1$) are noted as $Y_0$ and $Y_1$ respectively. Since the example illustrates a two transmit antenna/two receive antenna MIMO system, the four resulting RF signal paths are noted as $H_{00}$, $H_{01}$, $H1_{10}$, and $H_{11}$ (using the $H_{Tx\text{-}Rx}$ notation) and the data path is referred to as channel H. While, the example illustrated is a two antenna structure, the embodiments disclosed herein may operate within other known antenna configurations (e.g., 2×4, 2×8, 4×16, etc.)

Referring again to FIG. 3, reception of communication signals includes a multitude of stages within the analog receiver chain (e.g., RF front end 340 and down-conversion module 342) prior to converting the received analog communication signals to digital communication signals and processing the digital communication signals by processing module 346. One or more of these stages may be a gain stage, which enables an automatic gain control (AGC) module within the processing module 346 to control the gain along the receiver chain. Since the strength of the received communication signal can vary widely, depending on the power and distance of the transmitter and signal path attenuation, the AGC module prevents the receiver's output level from fluctuating too much by detecting the overall strength of the signal and automatically adjusting the gain of the receiver to maintain an approximately constant average output power level. For a very weak signal, the AGC module typically does not modify the receiver gain, allowing the receiver to operate at its maximum gain. However, as the signal strength increases, the AGC module may reduce the gain in the receiver to prevent the analog-to-digital converter (ADC) from clipping off the top of large signals, which can lead to high levels of distortion. Thus, the AGC module controls the gain in the receiver chain to maximize the signal to quantization noise ratio (SQNR) at the ADC output, while avoiding saturation of the various devices in the receiver chain and the digital signal at the ADC output.

The technical descriptions described herein, in various embodiments, account for and provide automatic gain control for the receiver chain. More specifically, the automatic gain control uses information from upstream in the receiver chain to estimate the signal strength of the received communication signal and set the receiver gain based on the estimated signal strength and the desired optimum signal strength (power) at the ADC.

Figure 5:
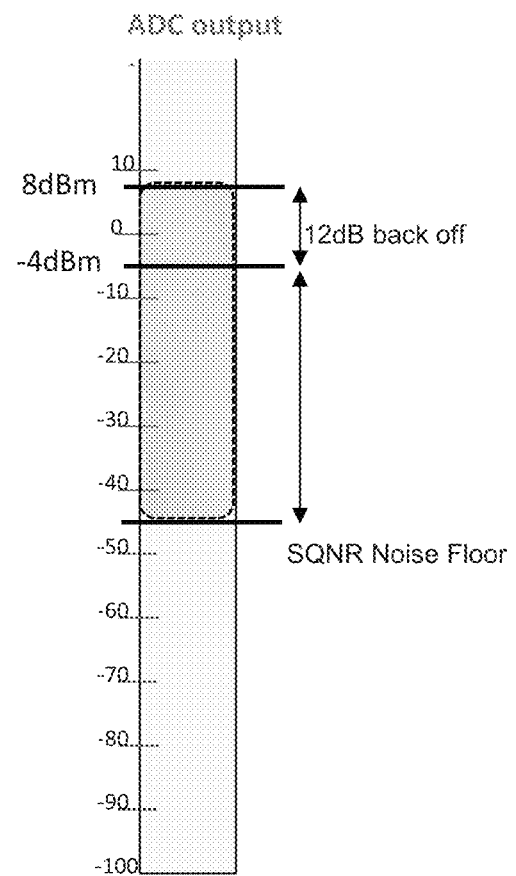
FIG. 5 illustrates an embodiment of an exemplary optimal signal strength at an input of an analog-to-digital converter (ADC)

FIG. 5 illustrates an embodiment of an exemplary optimal signal strength at an input of an analog-to-digital converter (ADC). An exemplary operating range of an ADC is shown in FIG. 5, with the peak power being approximately 8 dBm and the quantization noise floor being approximately −45 dBm. To maximize the SQNR and prevent clipping of the inbound radio frequency (RF) signal, the optimum power at the input to the ADC is approximately −4 dBm. In this embodiment, the AGC module would set the gain of the receiver such that the signal strength of the inbound RF signal at the ADC input is as close to −4 dBm as possible.

Figure 6:
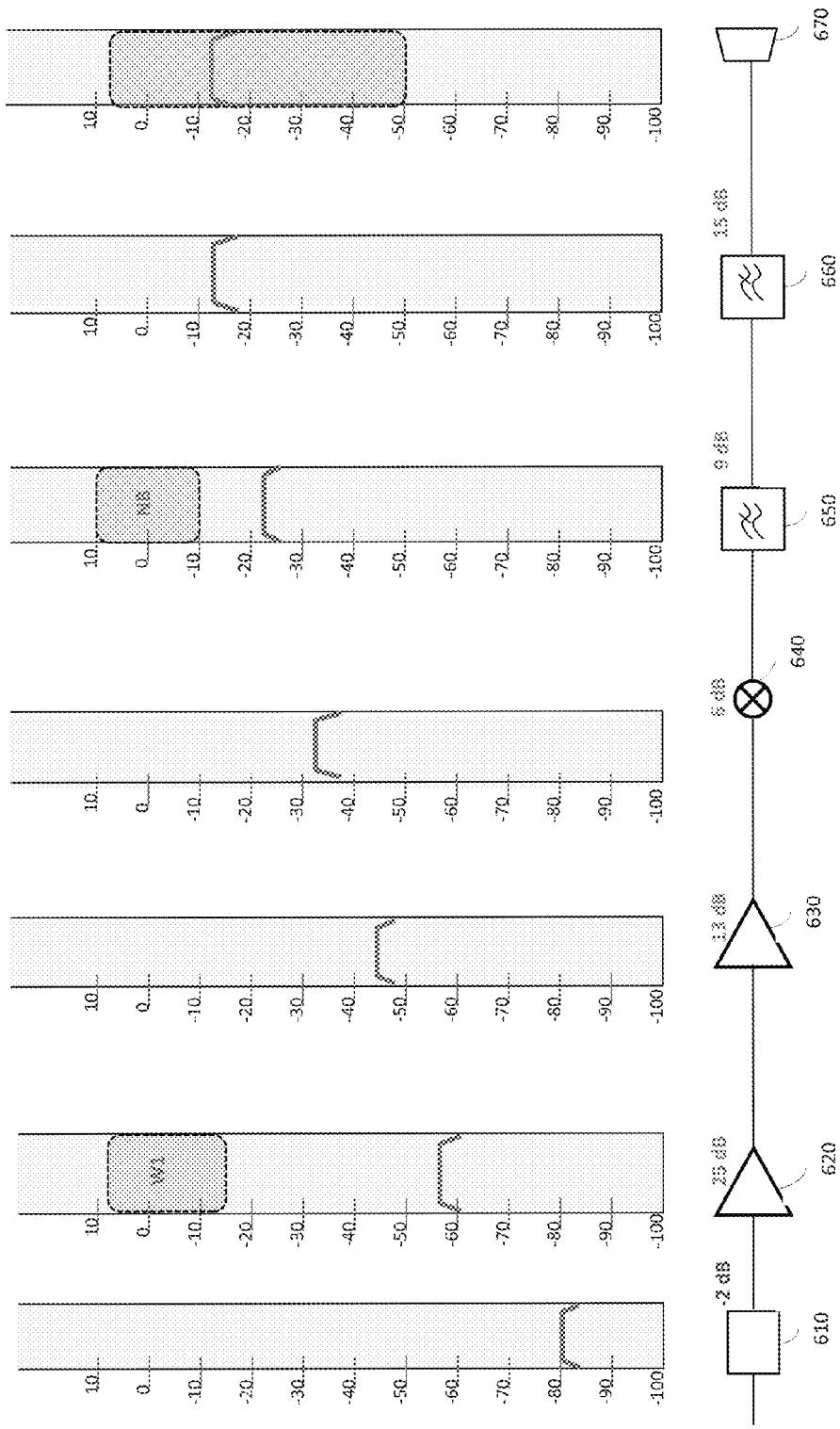
FIG. 6 illustrates an embodiment of an exemplary receiver chain with various gain stages.

FIG. 6 illustrates an embodiment of an exemplary receiver chain with various gain stages. As shown in FIG. 6, the gain stages within the receiver chain include a lossy element 610, low noise amplifiers (LNAs) 620 and 630, mixer 640, filters 650 and 660 and ADC 670. Each of the gain stages applies a respective gain to the received communication signal to bring the signal strength of the inbound RF signal into the operating range of the ADC.

For example, assuming an inbound RF signal has a signal strength of −80 dBm at the beginning of the receiver chain, the lossy element 610 applies a −2 dB gain to the inbound RF signal, bringing the signal strength down to −82 dBm. The first LNA 620 applies a gain of 25 dB to the inbound RF signal, bringing the signal strength up to −57 dBm, and the second LNA 630 applies a gain of 13 dB to the inbound RF signal, bringing the signal strength up to −44 dBm. The mixer 640 applies another 6 dB of gain to the inbound RF signal to bring the signal strength up to −38 dBm, and each of the mixers 650 and 660 applies a respective gain of 9 dB and 15 dB to bring the signal strength up to −29 dBm and −14 dBm, respectively. As such, at the input to the ADC 670, the inbound RF signal is within the operating range of the ADC 670. By modifying the gain applied by one or more of the gain stages within the receiver chain, the signal strength of the inbound RF signal can be brought as close to the optimum power level (e.g., −4 dBm) as possible. It should be understood that the gain stages shown in FIG. 6 are merely exemplary and that more or fewer gain stages may be included in the receiver chain.

Figure 7:
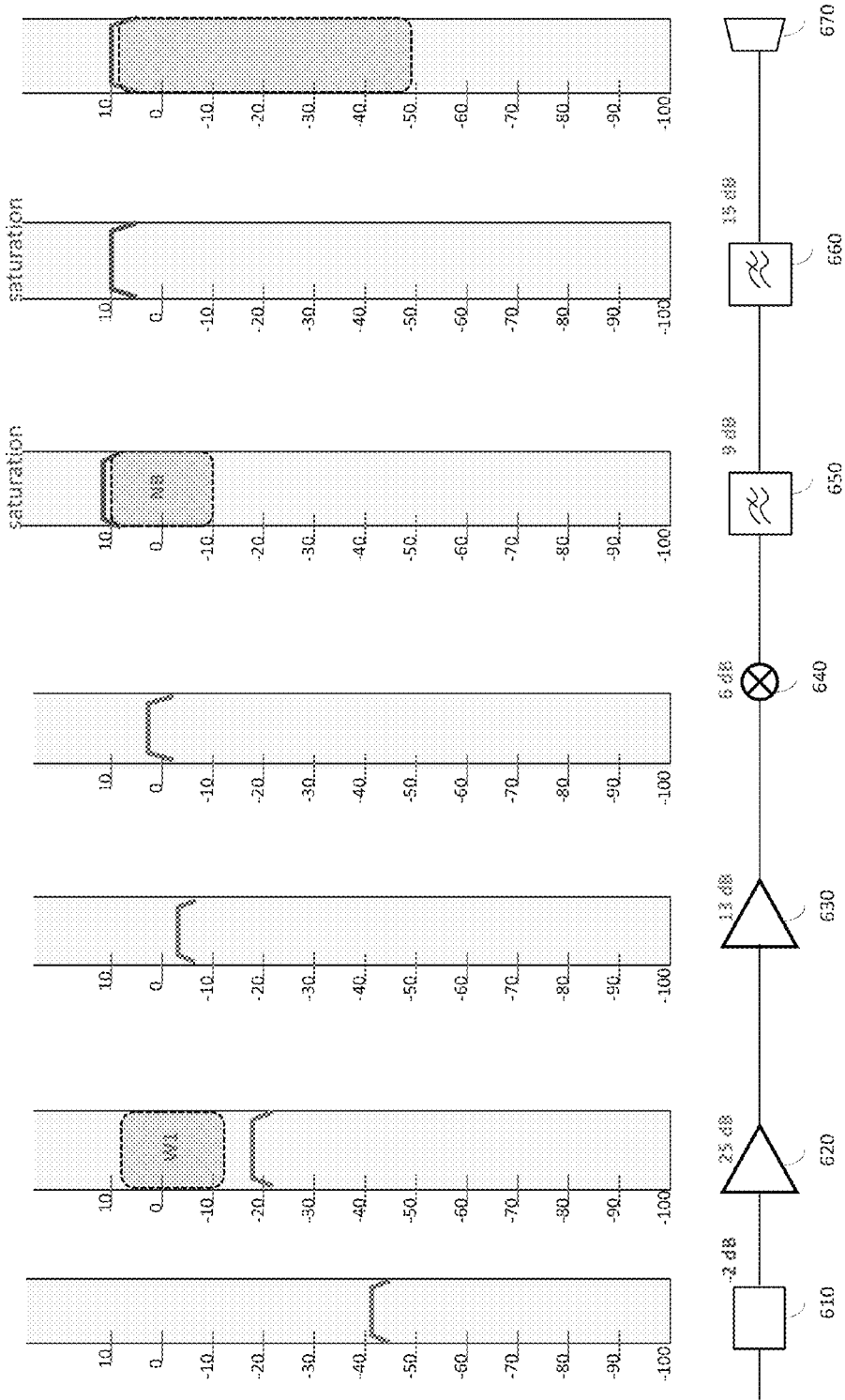
FIG. 7 illustrates an embodiment of an exemplary receiver chain where the inbound RF signal is clipped at one or more gain stages.

FIG. 7 illustrates an embodiment of an exemplary receiver chain where the inbound RF signal is clipped at one or more gain stages. In FIG. 7, the inbound RF signal has a signal strength of −40 dBm at the beginning of the receiver chain. Thus, using the same gain amounts as in FIG. 6 causes the inbound RF signal to saturate filters 650 and 660, which results in clipping of the inbound RF signal by the ADC 670.

To prevent clipping of the inbound RF signal, in accordance with embodiments of the present invention, the signal strength of the inbound RF signal can be estimated before carrier search to bring the signal into the operating range of the ADC and enable the carrier to be detected.

Figure 8:
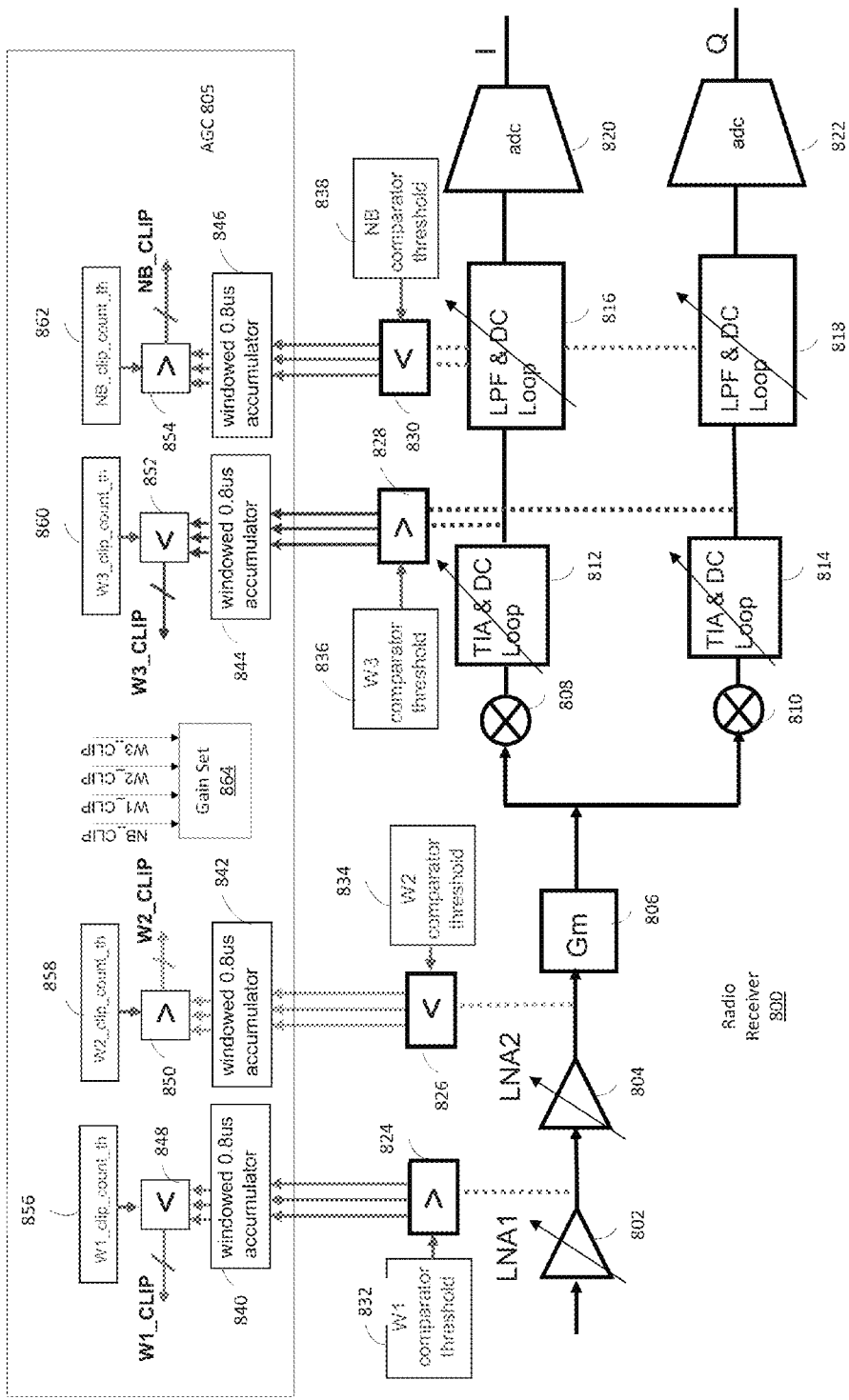
FIG. 8 illustrates an embodiment of the technology described herein where receiver signal strength indicator (RSSI) circuits are employed at multiple gain stages along the receiver chain to generate 1-bit outputs that are accumulated over time.

FIG. 8 illustrates an embodiment of the technology described herein which comprises suitable hardware/software in the form of circuitry, logic gates, and/or code that functions to estimate the signal strength of the inbound RF signal. As shown in FIG. 8, a plurality of received signal strength indication (RSSI) circuits 824-830 are coupled to respective output taps at various gain stages along the receiver chain of the radio receiver 800. For example, as shown in FIG. 8, the gain stages include LNA1 802 and LNA2 804, transconductance element 806, I/Q mixers 808 and 810, loop filters 812 and 814 and low pass filters 816 and 818. I/Q mixers 808 and 810 and loop filters 812 and 814 may collectively be referred to herein as a down-conversion module.

RSSI circuits 824-830 are shown coupled to the outputs of LNA1 802, LNA2 804 and loop filters 812 and 814 and to low pass filters 820 and 822. It should be understood that depending on the configuration of the receiver chain, more or fewer RSSI circuits may be employed. In addition, it should be understood that RSSI circuits may be placed at every gain stage or only a select number of gain stages within the receiver chain. Furthermore, in MIMO receivers, the power on each antenna may be different. Therefore, RSSI circuits may be included on each receive path.

Each RSSI circuit 824-830 generates a 1-bit clip information signal indicative of the signal strength of the inbound RF signal at the respective gain stage of the receiver chain. In an exemplary embodiment, each RSSI circuit 824-830 includes a comparator that compares the signal strength of the inbound RF signal to a respective programmable signal strength threshold (W1, W2, W3 and NB thresholds) 832-838 and generates a 1-bit clip/no-clip signal based on the comparison. For example, when the signal strength at RSSI circuit 824 exceeds the W1 threshold 832, RSSI circuit 824 generates a 1-bit clip signal. However, when the signal strength at RSSI circuit 824 does not exceed the W1 threshold 832, RSSI circuit 824 generates a 1-bit no clip signal.

The 1-bit clip information signals generated by the RSSI circuits 824-830 are output to an Automatic Gain Control (AGC) module 805 within a processor of the receiver (e.g., processing module 344 shown in FIG. 3) for further processing. In an exemplary embodiment, the AGC module 805 includes accumulators 840-846, each coupled to receive the 1-bit clip information signals of a respective RSSI circuit 824-830. Each accumulator 840-846 operates to accumulate a respective number of clip signals received over that predetermined window. For example, the predetermined window may correspond to the packet preamble time (i.e., 0.8 µs). Each accumulator 840-846 further outputs the respective number of clip signals received over the predetermined window to respective comparators 848-854.

Comparators 848-854 operate to compare the number of clip signals provided by the respective accumulator 840-846 with respective programmable clip count thresholds (W1, W2, W3 and NB thresholds) and generate respective clip average signals (e.g., W1_CLIP, W2_CLIP, W3_CLIP and NB_CLIP). For example, when the number of clip signals received by comparator 850 exceeds the W2 clip count threshold 858, comparator 850 generates a clip average signal that provides signal strength information indicating that the signal strength at the gain stage associated with comparator 850 exceeds the desired signal strength for that gain stage. However, when the number of clip signals received by comparator 850 does not exceed the W2 clip count threshold 858, comparator 850 generates a no clip average signal that provides signal strength information indicating that the signal strength at the gain stage associated with comparator 850 does not exceed the desired signal strength for that gain stage.

The outputs of comparators 848-854 (NB_CLIP, W1_CLIP, W2_CLIP and W3_CLIP) are input to gain setting circuitry 864, and are used by the gain setting circuitry 864 to set the gain of the receiver 800. For example, the gain setting circuitry 864 may determine a gain of the receiver 800 that will bring the signal strength of the inbound RF signal within the operating range of the ADC's 820 and 822, and preferably as close as possible to an optimum signal strength of the ADC's 820 and 822.

By using single-bit RSSI's to deliver clip/no-clip signals, the single-bit RSSI's can be implemented using a simple comparator, which can save both power and die area in comparison with traditional RSSI configurations. For example, in one traditional configuration, the RSSI's use comparators and analog filters in the radio to deliver raw RSSI values, which are then digitized by auxiliary ADC's for the consumption of the AGC module. The configuration shown in FIG. 8 simplifies the RSSI circuit by eliminating the analog filters and the auxiliary ADCs. In an exemplary embodiment, the simplified RSSI configuration shown in FIG. 8 consumes only approximate 33 μA, as compared with 20 mA with the traditional RSSI configuration. In addition, the die area can be reduced by approximately 0.4 μm$^2$ using the RSSI configuration of FIG. 8 as compared with the traditional RSSI configuration.

Figure 9:
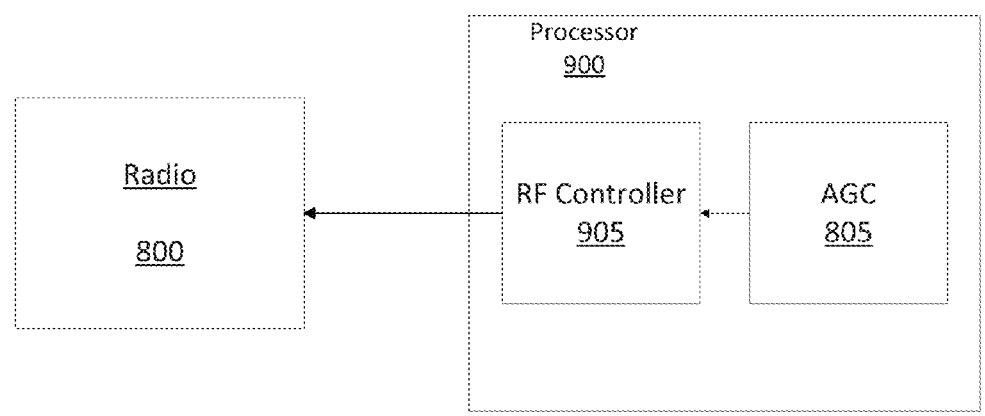
FIG. 9 illustrates an embodiment of the technology described herein where the automatic gain control module receives signal strength information associated with the accumulated RSSI outputs, estimates the signal strength of the inbound RF signal from the signal strength information and sets the gain of the receiver in response to the estimated signal strength.

FIG. 9 illustrates an embodiment of the technology described herein which comprises suitable hardware/software in the form of circuitry, logic gates, and/or code that functions to set the gain of the radio receiver 800. As shown in FIG. 9, a processor 900 (e.g., receiving processing module 344 of FIG. 3) includes the AGC module 805 and an RF controller 905.

The AGC module 805 uses the signal strength information in the clip average signals (e.g., NB_CLIP, W1_CLIP, W2_CLIP and W3_CLIP shown in FIG. 8) to estimate the signal strength of the inbound RF signal. The AGC module 805 further determines a desired overall gain of the radio receiver 800 in response to the estimated signal strength and the predetermined optimal power at the input to the ADC, as discussed above in connection with FIG. 5. The AGC module 805 inputs the desired gain to the RF controller 905, which generates control commands to the radio receiver 800 to set the gain of the radio receiver 800 accordingly. In an exemplary embodiment, the RF controller 905 operates to control a respective gain of one or more gain stages along the receiver chain to achieve the desired overall gain for the radio receiver 800. For example, the RF controller 905 may set the gain of one or more of LNA1 802, LNA2 804, down-conversion module 808-814 or low pass filters 816/818.

In one embodiment, the AGC module 805 sets the overall gain to a coarse gain level while sensing the carrier frequency. After sensing the carrier frequency, the AGC module 805 may further modify the gain of the radio receiver 800 in a fine gain control process based on the digital RMS observed at the output of the ADC in order to maximize the SQNR for packet demodulation. In another embodiment, as described in more detail below in connection with FIGS. 11 and 12, the AGC module 805 sets the gain in a single step using, for example, a lookup table. Such a single-step gain setting process enables the AGC module 805 to operate in ultra-low power applications, such as radio napping, since the gain can be set during the preamble time.

Figure 10:
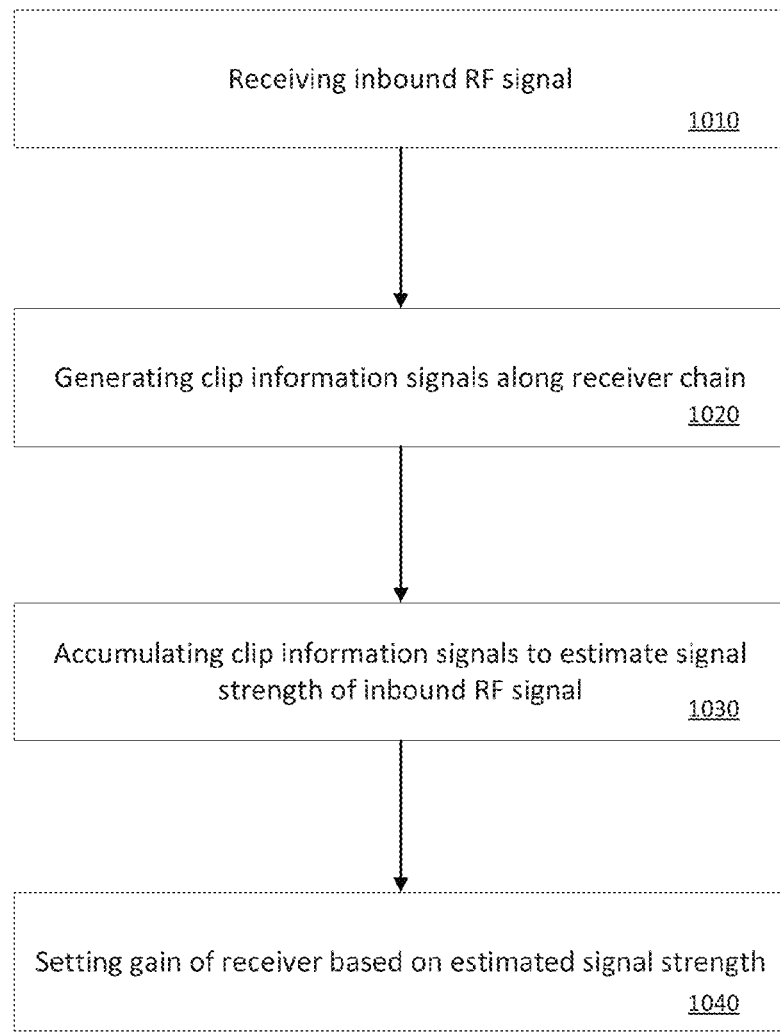
FIG. 10 illustrates an embodiment including a series of steps to set the gain of the receiver.

FIG. 10 illustrates one embodiment of a method for setting the gain of a radio receiver. As shown, in step 1010, an inbound RF signal is received by a radio receiver and provided along a receiver chain therein. In step 1020, the inbound RF signal is tapped off at different points (gain stages) along the receiver chain and 1-bit clip information signals indicative of the signal strength at each point are generated. In step 1030, the 1-bit clip information signals are accumulated over a predetermined window to estimate the signal strength of the inbound RF signal. In step 1040, the gain of the radio receiver is set based on the estimated signal strength.

Figure 11:
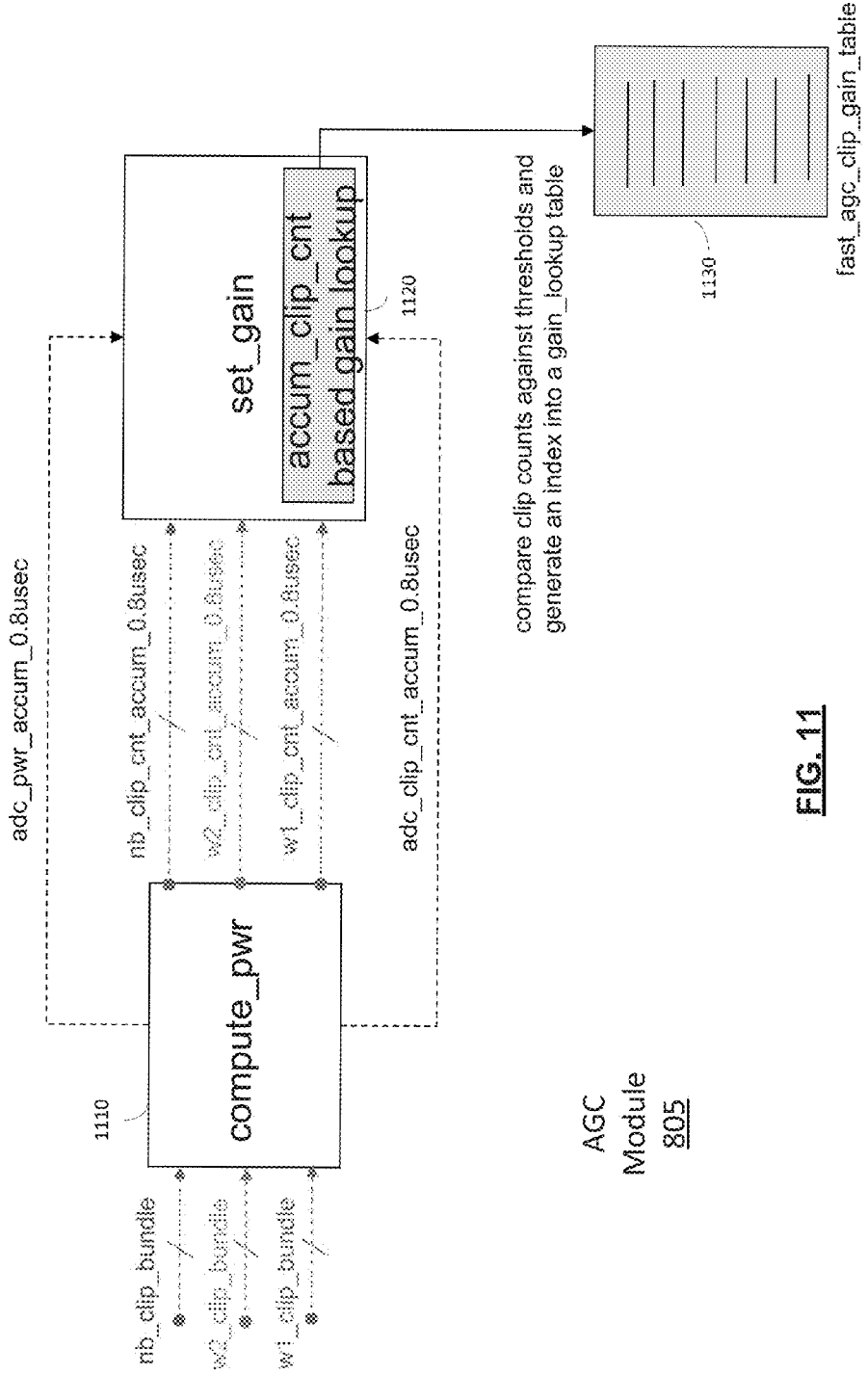
FIG. 11 illustrates an embodiment of the technology described herein using a lookup table to set the gain of the receiver.

FIG. 11 illustrates an embodiment of the technology described herein which comprises suitable hardware/software in the form of circuitry, logic gates, and/or code that functions to set the gain of the receiver using a lookup table. In FIG. 11, the functionality of the accumulators and comparators (shown in FIG. 8) are incorporated into the AGC module 805. For example, the functionality of the accumulators is implemented within a power computing module 1110 of the AGC module 805, while the functionality of the comparators and gain setting circuitry is implemented within a gain setting module 1120 of the AGC module 805.

The power computing module 1110 receives as input the clip information signals from each of the RSSI circuits within the radio receiver, and accumulates the clip information signals over a predetermined window (e.g., 0.8 μs) to determine a clip count (number of clip signals) for each of the RSSI circuits over the predetermined window. In FIG. 11, only three RSSI inputs (W1, W2 and NB) to the power computing module 1110 are shown, for simplicity. The power computing module 1110 further receives as input ADC information indicating whether the ADC has clipped and the ADC power level. The power computing module 1110 accumulates the ADC information over the predetermined window to produce an ADC clip count and an average ADC power.

The power computing module 1110 provides the accumulated clip count information (W1 clip count, W2 clip count, NB clip count and ADC clip count) and average ADC power information to the gain setting module 1120. The gain setting module 1120 compares the accumulated clip count information associated with each RSSI circuit with respective thresholds to set the gain of the receiver using a gain lookup table 1130. For example, the gain setting module 1120 can compare the clip counts against the respective thresholds to generate an index into the gain lookup table 1130.

In an exemplary embodiment, assuming the gain lookup table 1130 includes four receiver gain values (INIT_gain, HIGH_gain, MID_gain and LOW_gain), the gain setting module 1120 can utilize the following algorithm to generate an index into the gain lookup table 1130 for one of the four gain values:

---
If (ADC_clip_count >ADC_threshold)
  if (NB_clip_count>NB_threshold)
    if (W2_clip_count>W2_threshold)
      if (W1_clip_count>W1_threshold)
        set CLIP = LOW_gain;
      else, set CLIP = MID_gain;
    else, set CLIP = HIGH_gain;
  else, set CLIP = INIT_gain.

---

Exemplary gain values for each gain step may be, for example:
- INIT_gain=68 dB
- HIGH_gain=47 dB
- MID_gain=27 dB
- LOW_gain=9 dB Corresponding RSSI clip (signal strength) thresholds for each of the RSSI circuits may be, for example:
- ADC_clip_threshold=−62 dBm at antenna port
- NB_clip_threshold=−42 dBm at antenna port
- W2_clip_threshold=−20 dBm at antenna port
- W1_clip_threshold=0 dBm at antenna port For low power devices and/or applications, utilizing the gain lookup table 1130 enables the radio receiver gain to be set in one step, instead of two steps (i.e., coarse and fine gain control). For example, the RSSI circuits can each be programmed to clip at a different power designed to provide an accurate signal strength estimate (within an acceptable margin), and the gain lookup table 1130 can include appropriate gain values for each potential signal strength estimate. In an exemplary embodiment, the RSSI circuit clip levels may be spaced 6 dBm apart, so that the signal strength of the inbound RF signal can be accurately estimated to within +/−3 dBm.

Figure 12:
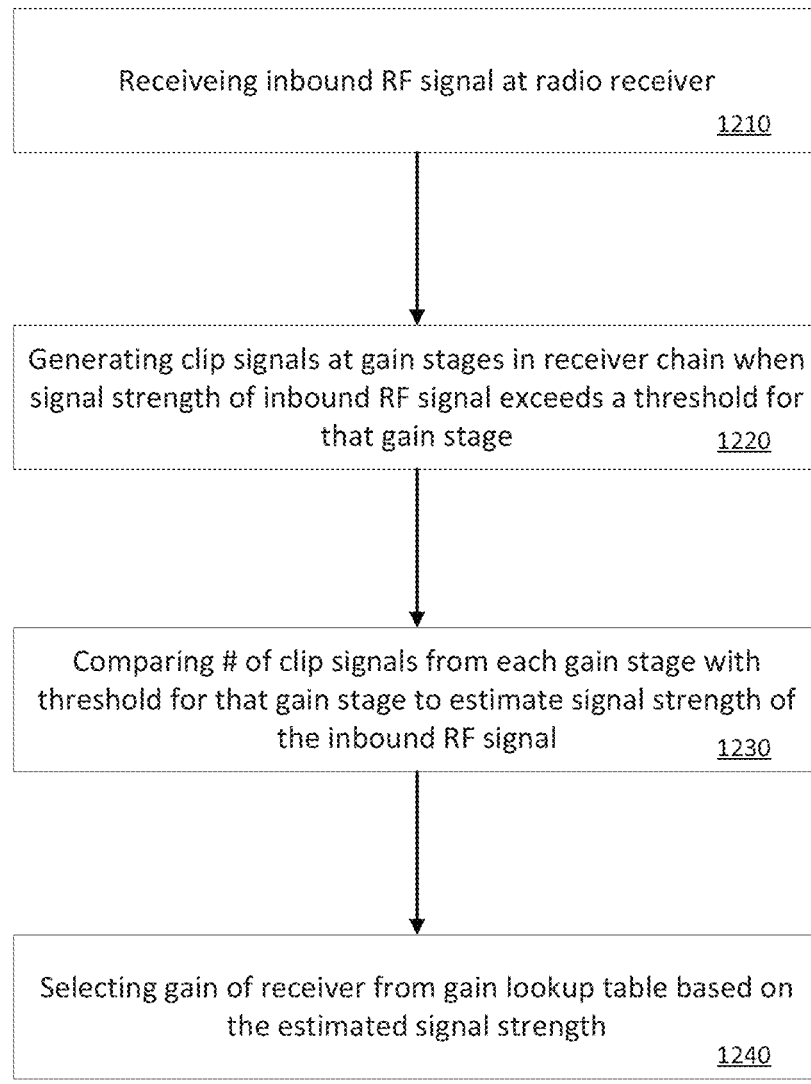
FIG. 12 illustrates an embodiment including a series of steps to use a lookup table to set the gain of the receiver.

FIG. 12 illustrates another embodiment of a method for setting the gain of a radio receiver. As shown, in step 1210, an inbound RF signal is received by a radio receiver and provided along a receiver chain therein. In step 1220, the inbound RF signal is tapped off at different points (gain stages) along the receiver chain and 1-bit clip information signals indicative of the signal strength at each point are generated. For example, the signal strength of the inbound RF signal at each gain stage can be compared to a respective signal strength threshold and a clip signal can be generated as the clip information signal when the signal strength at a particular gain stage exceeds the respective signal strength threshold.

In step 1230, the 1-bit clip information signals are accumulated over a predetermined window, and the number of clip signals generated at each gain stage are compared with respective clip count thresholds to estimate the signal strength of the inbound RF signal. In step 1240, the gain of the radio receiver is set by selecting a gain value from a gain lookup table based on the estimated signal strength.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "operably coupled to", "coupled to", and/or "coupling" includes direct coupling between items and/or indirect coupling between items via an intervening item (e.g., an item includes, but is not limited to, a component, an element, a circuit, and/or a module) where, for indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "operable to" or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item. As may be used herein, the term "compares favorably", indicates that a comparison between two or more items, signals, etc., provides a desired relationship.

As may also be used herein, the terms "processing module", "processing circuit", and/or "processing unit" may be a single processing device or a plurality of processing devices. Such a processing device may be a microprocessor, microcontroller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

The technology as described herein has been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claimed invention. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The technology as described herein may have also been described, at least in part, in terms of one or more embodiments. An embodiment of the technology as described herein is used herein to illustrate an aspect thereof, a feature thereof, a concept thereof, and/or an example thereof. A physical embodiment of an apparatus, an article of manufacture, a machine, and/or of a process that embodies the technology described herein may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

While particular combinations of various functions and features of the technology as described herein have been expressly described herein, other combinations of these features and functions are likewise possible. The technology as described herein is not limited by the particular examples disclosed herein and expressly incorporates these other combinations.

The invention claimed is:

1. A device, comprising:
   a radio receiver for receiving an inbound radio frequency (RF) signal and providing the inbound RF signal through gain stages along a receiver chain to produce an analog near baseband signal;
   a plurality of receiver signal strength indicator (RSSI) circuits, each coupled to a respective output tap of a respective one of the gain stages along the receiver chain of the radio receiver, each of the plurality of RSSI circuits generating respective clip information signals indicative of a respective signal strength of the inbound RF signal at the respective gain stage, each of the clip information signals being a 1-bit signal; and
   a processor for accumulating the clip information signals from the RSSI circuits over a predetermined window to estimate the signal strength of the inbound RF signal, the processor further for setting a gain of the radio receiver based on the estimated signal strength.

2. The device of claim 1, wherein each of the plurality of RSSI circuits includes a comparator for comparing the signal strength of the inbound RF signal with a programmable signal strength threshold.

3. The device of claim 2, wherein the clip information signal is a clip signal when the signal strength of the inbound signal exceeds the programmable signal strength threshold and a no clip signal when the signal strength of the inbound signal does not exceed the programmable signal strength threshold.

4. The device of claim 3, wherein the processor compares a number of clip signals generated by each of the plurality of RSSI circuits over the predetermined window with respective programmable clip count thresholds to estimate the signal strength of the inbound signal.

5. The device of claim 4, wherein the processor sets the gain of the radio receiver to a predetermined gain step based on the estimated signal strength of the inbound signal.

6. The device of claim 5, wherein the predetermined gain step is selected from a gain lookup table, the processor further for generating an index into the gain lookup table based on the estimated signal strength.

7. The device of claim 6, wherein the gain lookup table includes an initial gain step and additional gain steps, each having a lower gain than the initial gain step.

8. The device of claim 7, wherein the processor further selects the initial gain step from the gain lookup table when the number of clip signals for each of the plurality of RSSI circuits over the predetermined window does not exceed the respective programmable clip count thresholds, and the processor selects one of the additional gain steps from the gain lookup table when at least one of the programmable clip count thresholds is exceeded.

9. The device of claim 8, wherein the additional gain steps include a high-gain step, a mid-gain step and a low-gain step.

10. The device of claim 2, wherein values of each of the programmable signal strength thresholds are different.

11. The device of claim 10, wherein values each of the programmable signal strength thresholds are spaced apart by a predetermined amount.

12. The device of claim 1, wherein the predetermined window is 0.8 microseconds.

13. The device of claim 1, wherein the radio receiver includes:
    a low noise amplifier for receiving the inbound RF signal and amplifying the inbound RF signal to produce an amplified signal;
    a down-conversion module coupled to the low noise amplifier to receive the amplified signal and for converting the amplified signal to the analog near baseband signal;
    a low pass filter coupled to the down-conversion module to receive the baseband signal and for filtering the analog near baseband signal to produce a filtered analog near baseband signal; and
    an analog to digital converter (ADC) coupled to the radio receiver to receive the filtered analog baseband signal and operable to convert the analog near baseband signal to a digital near baseband signal.

14. The device of claim 13, wherein a respective one of the plurality of RSSI circuits is coupled to each of the low-noise amplifier, the down-conversion module and the low pass filter.

15. The device of claim 13, wherein the processor is further operable to control a respective gain of at least one of the analog-to-digital converter, low pass filter, low noise amplifier and down-conversion module based on the estimated signal strength.

16. A method for automatic gain control in a receiver, comprising:
    providing a received inbound radio frequency (RF) signal through gain stages along a receiver chain to produce an analog near baseband signal;
    generating respective clip information signals indicative of a respective signal strength of the inbound RF signal at different respective ones of the gain stages, each of the clip information signals being a 1-bit signal;
    accumulating the clip information signals from each of the gain stages along the receiver chain over a predetermined window to estimate the signal strength of the inbound signal; and
    setting a gain of the receiver based on the estimated signal strength.

17. The method of claim 16, wherein the generating respective clip information signals further includes:
    for each gain stage, comparing the signal strength of the inbound RF signal with a programmable signal strength threshold, the clip information signal being a clip signal when the signal strength of the inbound signal exceeds the programmable signal strength threshold and a no clip signal when the signal strength of the inbound signal does not exceed the programmable signal strength threshold.

18. The method of claim 17, wherein the accumulating the clip information signals further includes:

comparing a number of clip signals generated for each of the gain stages along the radio chain over the predetermined window with respective programmable clip count thresholds to estimate the signal strength of the inbound signal.

19. The method of claim 18, wherein the setting the gain further includes:

selecting the gain of the radio receiver from a gain lookup table, the gain lookup table including an initial gain step and additional gain steps, each having a lower gain than the initial gain step;

wherein the initial gain step is selected when the number of clip signals for each of the gain stages along the radio chain over the predetermined window does not exceed the respective programmable clip count thresholds;

wherein one of the additional gain steps is selected when at least one of the programmable clip count thresholds is exceeded.

20. An automatic gain control module for use in a radio receiver, comprising:

a plurality of accumulators, each coupled to a respective one of a plurality of receiver signal strength indicator (RSSI) circuits to receive and accumulate respective clip information signals therefrom over a predetermined window, each of the clip information signals being indicative of a respective signal strength of an inbound radio frequency (RF) signal at a respective gain stage along a receiver chain of the radio receiver, each of the clip information signals being a 1-bit signal; and a processor for estimating the signal strength of the inbound RF signal from the clip information signals accumulated over the predetermined window, the processor further for determining a gain setting to be applied to the radio receiver based on the estimated signal strength.

* * * * *